(12) United States Patent
Takahashi

(10) Patent No.: US 7,872,315 B2
(45) Date of Patent: Jan. 18, 2011

(54) ELECTRONIC SWITCHING DEVICE

(75) Inventor: Ryoji Takahashi, Saitama (JP)

(73) Assignee: Sanken Electric Co., Ltd. (JP)

( * ) Notice: Subject to any disclaimer, the term of this patent is extended or adjusted under 35 U.S.C. 154(b) by 0 days.

(21) Appl. No.: 12/717,615

(22) Filed: Mar. 4, 2010

(65) Prior Publication Data

US 2010/0155830 A1    Jun. 24, 2010

Related U.S. Application Data

(63) Continuation of application No. PCT/JP2008/065838, filed on Sep. 3, 2008.

(30) Foreign Application Priority Data

Sep. 7, 2007    (JP) .............................. 2007-232635

(51) Int. Cl.
*H01L 29/76*    (2006.01)
*H01L 29/94*    (2006.01)
*H01L 31/062*    (2006.01)
*H01L 31/113*    (2006.01)
*H01L 31/119*    (2006.01)
*H01L 29/32*    (2006.01)
*H01L 29/74*    (2006.01)
*H01L 31/111*    (2006.01)
*H01L 29/423*    (2006.01)
*H01L 29/43*    (2006.01)
*H01L 29/49*    (2006.01)

(52) U.S. Cl. .......................... 257/393; 257/107; 257/124; 257/133; 257/140; 257/155; 257/156; 257/E29.001; 257/E29.029; 257/E29.039; 257/E29.04; 257/E29.116

(58) Field of Classification Search ................. 257/107, 257/124, 133, 140, 155–156, 393, E29.001, 257/E29.029, E29.039, E29.04, E29.116
See application file for complete search history.

(56) References Cited

U.S. PATENT DOCUMENTS

| | | | | |
|---|---|---|---|---|
| 6,441,445 | B1 * | 8/2002 | Leonardi et al. | 257/378 |
| 6,501,129 | B2 * | 12/2002 | Osawa | 257/330 |
| 6,686,614 | B2 * | 2/2004 | Tihanyi | 257/155 |
| 6,690,085 | B2 * | 2/2004 | Nakagawa et al. | 257/656 |
| 6,998,678 | B2 * | 2/2006 | Werner et al. | 257/334 |
| 7,041,559 | B2 * | 5/2006 | Baliga | 438/268 |
| 7,067,876 | B2 * | 6/2006 | Yasuhara et al. | 257/335 |
| 7,535,040 | B2 * | 5/2009 | Yoshinobu | 257/273 |
| 7,582,519 | B2 * | 9/2009 | Kocon et al. | 438/197 |
| 7,598,567 | B2 * | 10/2009 | Hefner et al. | 257/328 |
| 2008/0265312 | A1 * | 10/2008 | Bhalla et al. | 257/328 |
| 2009/0008709 | A1 * | 1/2009 | Yedinak et al. | 257/331 |
| 2010/0084706 | A1 * | 4/2010 | Kocon | 257/330 |

FOREIGN PATENT DOCUMENTS

JP    07-015009 A    1/1995

* cited by examiner

*Primary Examiner*—Ida M Soward
(74) *Attorney, Agent, or Firm*—Woodcock Washburn LLP

(57) ABSTRACT

An integrated switching device has a switching IGFET connected between a pair of main terminals, a protector IGFET connected between the drain and gate electrodes of the switching IGFET, and a gate resistor connected between a main control terminal and the gate electrode of the switching IGFET. The protector IGFET has its gate electrode connected to the source electrode of the switching IGFET. The protector IGFET turns on in response to an application of a verse voltage to the switching IGFET thereby protecting the same from a reverse current flow.

16 Claims, 8 Drawing Sheets

ELECTRONIC SWITCHING DEVICE

CROSS REFERENCE TO RELATED APPLICATIONS

This is a continuation of Application PCT/JP2008/065838, filed Sep. 3, 2008, which claims priority to Japanese Patent Application No. 2007-232635, filed Sep. 7, 2007.

BACKGROUND OF THE INVENTION

This invention relates to a switching device for an electric circuit, and more specifically to a switching device using an insulated-gate field-effect transistor (IGFET) for switching, together with means for protecting the IGFET from a reverse current flow.

The IGFET of typical conventional make has a drain electrode connected to a drain region of a semiconductor substrate, a source electrode connected to both source and body regions of the substrate, and a gate electrode overlying a gate insulator on the surface of the body region exposed between the drain and source regions. The source electrode makes ohmic contact with not only the source region but the body region as well. As a consequence, the IGFET has a channel connecting the drain and source electrodes through a parasitic diode (sometimes referred to as a body diode or built-in diode) based upon the p-n junction between the drain and body regions, in addition to that through the body region. Assuming that the IGFET has a channel of n-type (n-channel), the parasitic diode is reverse biased, blocking current flow therethrough, when the drain electrode is higher in potential than the source electrode. However, the drain electrode may grow less in potential than the source electrode because of some operation of the electric circuit incorporating the IGFET or of a wrong connection between the electric circuit and the power supply such as a battery. The parasitic diode will be forward biased in that case, permitting a current flow therethrough. The drain-source current flow is uncontrollable by the control voltage applied between gate and source as long as a current flows through the parasitic diode. What is worse, any large current flow through the parasitic diode can lead to the destruction of the IGFET itself or of the electric circuit.

One conventional approach to how to avoid the current flow through the parasitic diode of the IGFET was a serial connection of the IGFET and an external diode (reverse-blocking diode), the latter being polarized opposite to the parasitic diode. This external diode may be formed either on the same substrate as the IGFET or on a separate one. The substrate became inconveniently bulky, and the resulting composite device expensive, in the former case. In the latter case, too, the combination of the IGFET and the discrete external diode became bulky and expensive. The serial connection of the external diode with the IGFET was itself disadvantageous because of a large power loss incurred by the flow of current of the same magnitude through the diode as through the IGFET. Furthermore, when the drain was less in potential than the source, that is, when a reverse voltage was being impressed, the current flow through the IGFET was uncontrollable by the gate voltage.

With a view to defeating the problems arising from use of the external diode in combination with the MOSFET of the noted prior art construction, Japanese Unexamined Patent Publication No. 7-15009 proposes an advanced planar MOSFET where the source electrode is in Schottky contact with the body region. The present applicant also suggested in Japanese Patent Application 2006-326811 a trenched IGFET in which the source electrode is in Schottky contact with the body region. The Schottky contact of the source electrode with the body region results in the creation of a Schottky diode that functions to block reverse current flow.

The present invention proposes a novel switching device incorporating IGFETs, each with a built-in Schottky diode, which are per se of the conventional design noted above. The equivalent circuit of each such IGFET can be drawn as at 14 and 15 in FIG. 2 of the drawings attached hereto. Although this figure is an illustration of one of the preferred forms of the switching device according to the invention, the prior art IGFET with the built-in Schottky diode will be explained hereinbelow with reference to FIG. 2 and as exemplified by the main switching IGFET 14 depicted therein.

The exemplified IGFET 14 comprises a FET $Q_1$, two p-n junction diodes $D_a$ and $D_b$, and a Schottky barrier diode $D_c$. The first p-n junction diode $D_a$ is a parasitic (body) diode based upon the p-n junction between n-type drain and p-type body. The second p-n junction diode $D_b$ is a parasitic (built-in) diode based upon the p-n junction between p-type body region and n-type source region. The Schottky barrier diode $D_c$ is based upon the schottky junction between source electrode $S_1$ and p-type body region.

Polarized to be reverse biased when the drain electrode $D_1$ is higher in potential than the source electrode $S_1$, the first p-n junction diode $D_a$ is connected in inverse parallel with the FET switch $Q_1$. The second p-n junction diode $D_b$ on the other hand is opposite in polarity to the first p-n junction diode $D_a$ and is connected in series therewith.

In a more conventional IGFET not having the Schottky barrier diode $D_c$, this part of the device is short-circuited, so the second p-n junction diode $D_b$ has no function at all and therefore does not appear in the equivalent circuit. Opposite in polarity to the first p-n junction diode $D_a$, the Schottky barrier diode $D_c$ is connected in series with the first p-n junction diode $D_a$ and in parallel with the second p-n junction diode $D_b$.

Let it be supposed that both second p-n junction diode $D_b$ and Schottky barrier diode $D_c$ have a sufficient antivoltage strength. During application of a reverse voltage to this IGFET 14, when the source electrode $S_1$ is higher in potential than the drain electrode $D_1$, the reverse current will be blocked by the second p-n junction diode $D_b$ and Schottky barrier diode $D_c$. However, when the source electrode $S_1$ is positive, and the drain electrode $D_1$ negative, in potential, then the gate electrode $G_1$ will have a positive potential owing to the parasitic capacitance between source electrode $S_1$ and gate electrode $G_1$.

As the gate electrode $G_1$ thus becomes higher in potential than the body region, the depletion layer due to the p-n junction between the body and source regions will become locally so thin adjacent the gate electrode $G_1$ (where the p-n junction is exposed) that the second p-n junction diode $D_b$ will suffer a loss in antivoltage strength. If the voltage between source electrode $S_1$ and drain electrode $D_1$ is very high, the second p-n junction diode $D_b$ will become so poor in antivoltage strength as to become virtually dysfunctional, permitting a reverse current flow therethrough. There will then be no merit at all accruing from the presence of the Schottky barrier diode $D_c$.

SUMMARY OF THE INVENTION

It is therefore an object of this invention to provide a switching device which incorporates an IGFET of the kind having a reverse-blocking schottky diode and in which this IGFET is effectively protected against reverse current flow.

For the attainment of the foregoing object the present invention provides a switching device comprising: (a) a pair of main terminals to which a voltage is to be applied; (b) a main control terminal for inputting a control signal; (c) an IGFET for performing a main switching function for the switching device; and (d) protector switch means for protecting the IGFET. The IGFET comprises: (a) a drain region of a first conductivity type; (b) a body region of a second conductivity type formed contiguous to the drain region and having an exposed surface; (c) a source region of the first conductivity type formed in the body region and having an exposed surface; (d) a drain electrode disposed in ohmic contact with the drain region and electrically coupled to one of the pair of main terminals; (e) a source electrode disposed in ohmic contact with the source region and in Schottky contact with the body region and electrically coupled to the other of the pair of main terminals; (f) a gate insulator covering the exposed surface of the body region between the source region and the drain region; and (g) a gate electrode held against the exposed surface of the body region via the gate insulator. The protector switch means protects the IGFET by becoming conductive when a voltage oriented to reverse-bias the Schottky contact of the IGFET transistor is applied between the drain and source electrodes of the IGFET transistor. The protector switch means comprises: (a) a first main terminal connected to the drain electrode of the IGFET; (b) a second main terminal connected to the gate electrode of the IGFET; and (c) a control terminal.

Preferably, the control terminal of the protector switch means is connected to the source electrode of the IGFET in order to hold the protector switch means on when the control signal for turning the IGFET on is not applied to the main control terminal of the switching device while the voltage oriented to reverse-bias the Schottky contact of the IGFET is being applied between the drain and source electrodes of the IGFET.

Preferably, the switching device further comprises a resistor electrically connected between the main control terminal and the gate electrode of the IGFET.

Preferably, the protector switch means is a semiconductor switch formed on the same semiconductor substrate as the IGFET.

Preferably, the protector switch means is a second IGFET for selectively providing a short-circuit path between the drain and gate electrodes of the first recited IGFET. The second IGFET may comprise: (a) a drain region of a first conductivity type; (b) a body region of a second conductivity type formed contiguous to the drain region of the second IGFET and having an exposed surface; (c) a source region of the first conductivity type formed in the body region and having an exposed surface; (d) a drain electrode disposed in ohmic contact with the drain region of the second IGFET and electrically connected to the drain electrode of the first IGFET; (e) a source electrode disposed in ohmic contact with the source region of the second IGFET and in Schottky contact with the body region of the second IGFET and electrically connected to the gate electrode of the first IGFET; (f) a gate insulator covering the exposed surface of the body region of the second IGFET between the source region and the drain region thereof; and (g) a gate electrode held against the exposed surface of the body region of the second IGFET via the gate insulator and electrically connected to the source electrode of the first IGFET.

Preferably, the second IGFET is less in current-carrying capacity than the first IGFET.

Preferably, the drain region of each of the first and the second IGFET comprises a first drain subregion of the first conductivity type, and a second drain subregion formed contiguous to the first drain subregion of the drain region and having a lower first conductivity type impurity concentration than the first drain subregion of the drain region. The body region of each of the first and the second IGFET comprises a first body subregion of the second conductivity type formed contiguous to the second drain subregion of the drain region, and a second body subregion formed contiguous to the first body subregion of the body region and having a lower second conductivity type impurity concentration than the first body subregion of the body region, the second body subregion of the body region having the exposed surface. The source region of each of the first and the second IGFET comprises a first source subregion of the first conductivity type formed in the second body subregion of the body region and having the exposed surface, and a second source subregion formed in the first source subregion of the source region and having a higher first conductivity type impurity concentration than the first source subregion of the source region.

The present invention is also directed to a switching device comprising: (a) a pair of main terminals to which a voltage is to be applied; (b) a main control terminal for inputting a control signal; (c) an IGFET for performing a switching function for the switching device; and (d) protector switch means for protecting the IGFET. The IGFET comprises: (a) a substrate of semiconducting material having a pair of opposite major surfaces and a trench extending from one of the pair of major surfaces toward the other; (b) a drain region of a first conductivity type formed in the substrate and having a surface exposed at said other major surface of the substrate; (c) a body region of a second conductivity type formed in the substrate contiguous to the drain region and having a surface exposed to the trench in the substrate and another surface exposed at said one major surface of the substrate; (d) a source region formed in the substrate contiguous to the body region and having a surface exposed to the trench and another surface exposed at said one major surface of the substrate; (e) a drain electrode disposed on said other major surface of the substrate in ohmic contact with the drain region and electrically connected to one of the pair of main terminals; (f) a source electrode disposed on said one major surface of the substrate in ohmic contact with the source region and in Schottky contact with the body region and electrically connected to the other of the pair of main terminals; (g) a gate insulator formed in the trench in the substrate and covering at least the surface of the body region exposed to the trench; and (h) a gate electrode disposed in the trench in the substrate and held via the gate insulator against the surface of the body region exposed to the trench. In order to protect the IGFET by becoming conductive when a voltage oriented to reverse-bias the Schottky contact of the IGFET is applied between the drain and source electrodes of the IGFET, the protector switch means comprises: (a) a first main terminal connected to the drain electrode of the IGFET; (b) a second main terminal connected to the gate electrode of the IGFET; and (c) a control terminal.

Preferably, in the switching device with the trenched IGFET, as in that with the non-trenched IGFET, the control terminal of the protector switch means is connected to the source electrode of the IGFET.

Preferably, in the switching device with the trenched IGFET, a resistor is connected between the main control terminal and the gate electrode of the IGFET.

Preferably, in the switching device with the trenched IGFET, the protector switch means takes the form of a semiconductor switch formed on the same semiconductor substrate as the IGFET.

Preferably, in the switching device with the trenched IGFET, the protector switch means is a second IGFET for selectively providing a short-circuit path between the drain and gate electrodes of the first recited IGFET.

Preferably, in the switching device with the trenched IGFET, the two IGFETs are of like construction.

Preferably, in the switching device with the trenched IGFET, the second IGFET is less in current-carrying capacity than the first recited IGFET.

Preferably, in the switching device with the trenched IGFET, the first and the second IGFET have drain, body and source regions which are each subdivided into two subregions.

Preferably, the body region of the trenched first IGFET comprises a first body subregion spaced from the trench and a second body subregion contiguous to the trench, the second body subregion of the body region being higher in second conductivity type impurity concentration than the first body subregion of the body region.

Preferably, the body region of the trenched first IGFET has minority carriers that have a lifetime shortened by electron beam irradiation.

The switching device according to the invention gains the following advantages:

1. The switching device incorporates an IGFET having a Schottky-barrier diode built into it, thereby equivalently creating a p-n junction diode between the body and source regions. Were it not for the protector switch means suggested by this invention, however, the p-n junction diode might suffer a loss in antivoltage strength, as has been discussed hereinabove in connection with the prior art, upon application of a voltage reverse-biasing the Schottky-barrier diode and p-n junction diode. The p-n junction diode would then be incapable of blocking a reverse current flow. No such trouble will occur thanks to the protector switch means according to the invention, which will turn on upon application of a reverse voltage between the drain and source electrodes of the insulated-gate field effect transistor. The protector switch means upon turning on will provide a short-circuiting connection between the drain and gate electrodes of the insulated-gate field effect transistor thereby protecting the same and hence the electric circuit connected across the transistor. More specifically, upon conduction of the protector switch means, the potential of the gate electrode of the IGFET will come close to that of its drain electrode, so there will be virtually no drop in the antivoltage strength of the p-n junction diode due to the potential of the gate electrode. Thus are the IGFET and associated electric circuit protected from a reverse current flow.

2. The IGFET and protector switch means of the switching device according to the invention are compactly integrated into a single device having but three terminals, a pair of main terminals and a control terminal, for connection to external circuitry. The device is therefor highly convenient of use.

In some preferred embodiments of the invention the protector switch means takes the form of an IGFET similar in construction to the switching IGFET. The reverse-current-protected switching device with two IGFETs of like construction is easier and less expensive than if the protector switch means were of different make from the switching IGFET.

In some preferred embodiments of the invention the drain region of the substrate is subdivided into two subregions of different impurity concentrations, and so is the body region of the substrate, with consequent improvement in the electrical characteristics of the switching IGFET.

In some preferred embodiments of the invention the switching IGFET is trenched and so made less not only in size but in on-resistance too.

DESCRIPTION OF THE PREFERRED EMBODIMENTS

Figure 1:
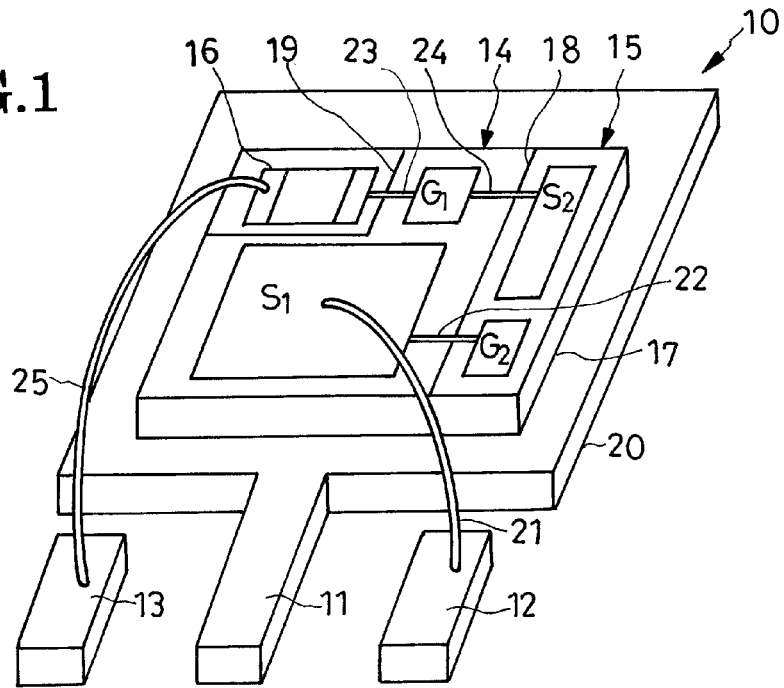
FIG. 1 shows in perspective the switching device constructed in accordance with the novel concepts of this invention.

The switching device according to the invention will now be described more specifically in terms of the composite integrated semiconductor device illustrated in FIG. 1 of the drawings and therein generally designated 10. The representative device 10 comprises a first and a second main terminal 11 and 12 to which a voltage is impressed, a main control terminal 13 for inputting a control signal, a first IGFET 14 which performs the primary switching function for the device 10, a second IGFET 15 which serves to protect the first IGFET 14 against a reverse current flow, and a current-limiting gate resistor 16. The first IGFET 14 will be hereinafter referred to as the switching IGFET, and the second IGFET 15 as the protector IGFET.

Both switching IGFET 14 and protector IGFET 15 have a built-in reverse-blocking Schottky diode, as will be detailed presently. These IGFETs 14 and 15 as well as the gate resistor 16 are all built in the form of a monolithic integrated circuit on one and the same semiconducting silicon substrate 17. The line 18 drawn in FIG. 1 on the exposed top surface of the substrate 17 for convenience indicates the boundary electrically separating the two IGFETs 14 and 15. The line 19 in the same figure likewise marks the boundary between switching IGFET 14 and gate resistor 16. The semiconductor regions constituting the devices fabricated on the substrate 17 are not indicated in FIG. 1. Nor is the insulating film on the surface of the substrate 17 shown in this figure in order to reveal the underlying parts. It is understood that the IGFETs 14 and 15 have each a drain electrode, not seen in FIG. 1, formed on the underside of the substrate 17 and coupled to the underlying metal-made baseplate 20 both electrically and mechanically.

The baseplate 20 is formed in one piece with the first main terminal 11 of the switching device 10.

The source and gate electrodes of the switching IGFET 14 are indicated respectively at $S_1$ and $G_1$, and the source and gate electrodes of the protector IGFET 15 at $S_2$ and $G_2$, on the surface of the substrate 17. The source electrode $S_1$ of the switching IGFET 14 is connected both to the second main terminal 12 by way of a conductor 21 and to the gate electrode $G_2$ of the protector IGFET 15 by way of a conductor 22. The gate electrode $G_1$ of the switching IGFET 14 is connected both to one extremity of the gate resistor 16 by way of a conductor 23 and to the source electrode $S_2$ of the protector IGFET 15 by way of a conductor 24. The other extremity of the gate resistor 16 is connected to the main control terminal 13 by way of a conductor 25. Integrally comprising the two IGFETs 14 and 15 and gate resistor 16, this switching device lends itself to use as a unitary three-terminal device.

Figure 2:
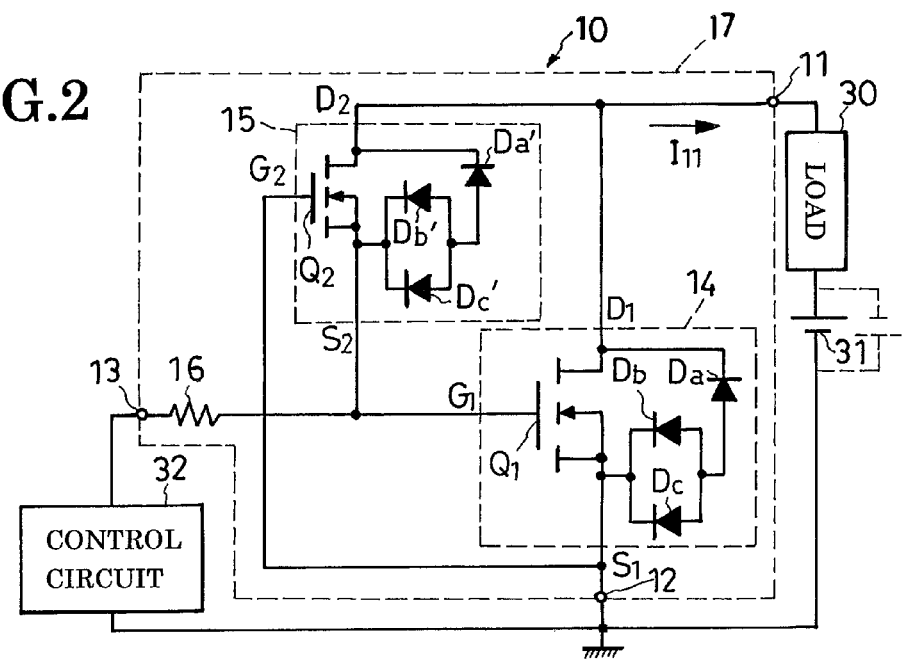
FIG. 2 is an equivalent circuit diagram of the switching device of FIG. 1.

FIG. 2 is an equivalent electric circuit of the switching device 10 mechanically constructed as set forth hereinbefore with reference to FIG. 1. The switching IGFET 14 of the switching device 10 is herein equivalently diagrammed as comprising an n-channel FET switch $Q_1$, two p-n junction (or parasitic) diodes $D_a$ and $D_b$, and a Schottky barrier diode $D_c$. The first p-n junction diode $D_a$ of the switching IGFET 14 has its cathode connected to the drain electrode $D_1$, and its anode to the anodes of the second p-n junction diode $D_b$ and Schottky barrier diode $D_c$. Both second p-n junction diode $D_b$ and Schottky barrier diode $D_c$ of the switching IGFET 14 have their cathodes connected to the source electrode $S_1$. Thus the second p-n junction diode $D_b$ is in serial connection with the first p-n junction diode $D_a$, with their polarities oriented opposite each other. The Schottky barrier diode $D_c$ is likewise connected in series with the first p-n junction diode $D_a$ in opposite polarities.

The switching IGFET 14 as a whole has its drain electrode $D_1$ connected to the first main terminal 11 of the switching device 10, its source electrode $S_1$ to the second main terminal 12 of the switching device, and its gate electrode $G_1$ to the main control terminal 13 of the switching device via the gate resistor 16.

With continued reference to FIG. 2 the protector IGFET 15 of the illustrated switching device 10 is of the same construction as the switching IGFET 14 except that the former is less in size and current-carrying capacity. Thus, electrically, the protector IGFET 15 also comprises an n-channel FET switch $Q_2$, two p-n junction diodes $D_a'$ and $D_b'$ and a Schottky barrier diode $D_c'$. The first p-n junction diode $D_a'$ of the protector IGFET 15 has its cathode connected to the drain electrode $D_2$, the first main terminal of the protector IGFET, and its anode to the anodes of the second p-n junction diode $D_b'$ and Schottky barrier diode $D_c'$. Both second p-n junction diode $D_b'$ and Schottky barrier diode $D_c'$ of the protector IGFET 15 have their cathodes connected to the source electrode $S_2$, the second main terminal of the protector IGFET. Thus is the second p-n junction diode $D_b'$ connected in series with the first p-n junction diode $D_a'$ with their polarities oriented opposite each other. The Schottky barrier diode $D_c'$ is likewise connected in series with the first p-n junction diode $D_a'$ in opposite polarities.

The protector IGFET 15 of the switching device 10 has its drain electrode $D_2$ connected to the drain electrode $D_1$ of the switching IGFET 14, its source electrode $S_2$ to the gate electrode $G_1$ of the switching IGFET 14, and its gate electrode $G_2$ to the source electrode $S_1$ of the switching IGFET 14. The gate electrode $G_2$ of the protector IGFET 15 serves as its control input.

FIG. 2 further indicates that the pair of main terminals 11 and 12 of the switching device 10 is connected respectively to the pair of opposite polarity terminals of a power supply 31 via a load 30. The power supply 31 need not be a battery, as shown, or other dc source but may be an ac source as well. Introduced into the switching device 10 according to the present invention, the protector IGFET 15 functions to prevent an abnormal current flow through the switching IGFET 14 when the power supply 31 is connected with its polarity inverted, as indicated by the dashed lines in FIG. 2.

Also seen in block form in FIG. 2 is a gate control circuit 32 connected between the main control terminal 13 and second main terminal 12 of the switching device 10. The gate control circuit 32 applies a positive, above-threshold gate control voltage between the gate electrode $G_1$ and source electrode $S_1$ of the switching IGFET 14 for turning this IGFET on. For turning the switching IGFET off, on the other hand, the gate control circuit 32 makes the main control terminal 13 of the switching device 10 approximately equal in potential to the source electrode $S_1$ of the switching IGFET. In other words, for turning the switching IGFET 14 off, a short-circuit connection is provided between the main control terminal 13 of the switching device 10 and the source electrode $S_1$ of the switching IGFET 14.

Figure 3:
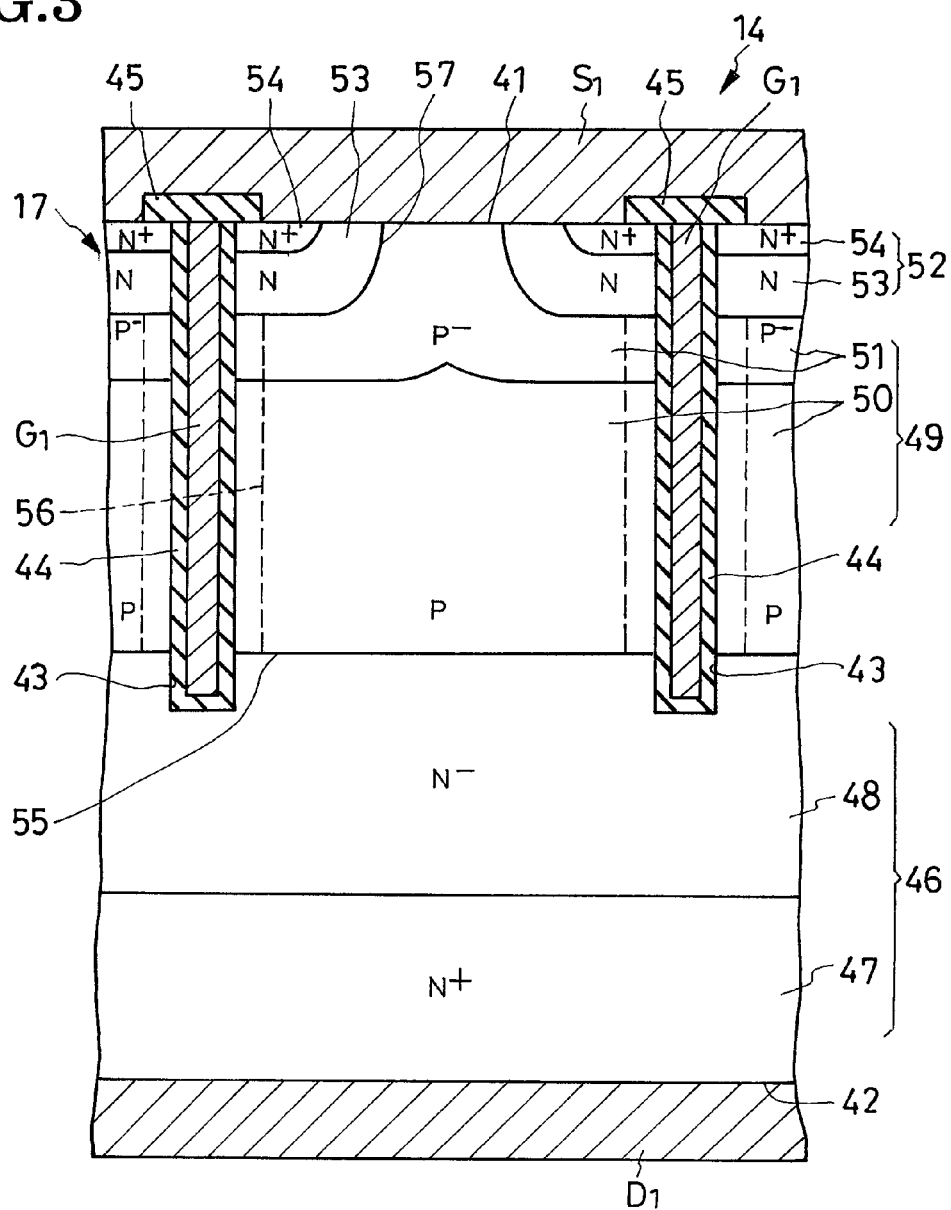
FIG. 3 is a section through the switching IGFET in the switching device of FIGS. 1 and 2.

FIG. 3 is a greatly enlarged, fragmentary sectional view of the switching IGFET 14 in the switching device 10 of FIGS. 1 and 2. The semiconducting silicon substrate 17, set forth above in connection with FIG. 1, has trenches 43, one for each IGFET cell, each trench extending from the first or top surface 41 of the substrate down toward its second or bottom surface 42 and terminating at approximately the middle of the thickness dimension of the substrate. The source electrode $S_1$ is formed on the top surface 41 of the substrate 17, the drain electrode $D_1$ on the bottom surface 42 of the substrate, and the gate electrode $G_1$ in the trench 43. Although wholly received in the trench 43, the gate electrode $G_1$ is electrically separated from the substrate 17 by a gate insulator 44, and from the source electrode $S_1$ by another gate insulator 45. It is understood that the gate electrode $G_1$ is joined to the conductors 23 and 24, FIG. 1, for connection to the gate resistor 16 and the source electrode $S_2$ of the protector IGFET 15.

The substrate 17 is broadly divided into three regions, a drain region 46, a body region 49 and a source region 52. The drain region 46 is subdivided into an $n^+$-type first drain subregion 47 of high impurity concentration and an $n^-$-type second drain subregion 48 having a lower impurity concentration than the first drain subregion 47. The body region 49 is subdivided into a p-type first body (or base) subregion 50 and a $p^-$-type second body (or base) subregion 51 having a lower impurity concentration than the first body subregion 50. The source region 52 is subdivided into an n-type first source subregion 53 and an $n^+$-type second source subregion 54 having a higher impurity concentration than the first source subregion 53. What follows is a more detailed study of all the individual subregions 47, 48, 50, 51, 53 and 54 of the three regions 46, 49 and 52 of the substrate 17.

Exposed at the bottom surface 42 of the substrate 17, the $n^+$-type first subregion 47 of the drain region 46 has an n-type impurity concentration as high as, say, from $1 \times 10^{19}$ cm$^{-3}$ to $1 \times 10^{20}$ cm$^{-3}$. The $n^-$-type second subregion 48 of the drain region 46, also known as drift region, immediately overlies the first subregion 47 and has a less impurity concentration of, say, from $1 \times 10^{15}$ cm$^{-3}$ to $1 \times 10^{17}$ cm$^{-3}$. This second drain subregion 48 is conducive to improvement of the antivoltage strength of the IGFET. The carriers are field accelerated in the second drain subregion 48 of low impurity concentration, so this subregion performs the same function as the high resistance collector region of the bipolar transistor.

The n+-type first subregion 47 of the drain region 46 may be formed by diffusing n-type impurities into an n−-type substrate. Alternatively, an n+-type substrate may be employed, and the n−-type second drain subregion 48 may be grown thereon by epitaxy. The second drain subregion 48 of this particular embodiment is what is left of an n−-type substrate after the creation of the first subregion 47 of the drain region 46 and the body region 49 and source region 52.

The trench 43 is shown to extend from the top surface 41 of the substrate 17 through the source region 52 and body region 49 down slightly into the second drain subregion 48. Broadly, however, the trench 43 may extend either into or throughout the second drain subregion 48. The trench 43 is at right angles with the opposite, parallel surfaces 41 and 42 of the substrate 17.

It is understood that, as is customary with the fabrication of integrated semiconductor devices, the substrate 17 has a plurality or multiplicity of IGFET cells of like configuration. FIG. 3 shows only two trenches 43 and neighboring parts of the substrate regions 46, 49 and 52. This embodiment employs an n−-type substrate 17, and the n+-type first drain subregion 47 and p-type first body subregion 50 are created therein. The trenches 43 are made subsequently by anisotropic etching. When these trenches are made is variable at will.

The first subregion 50 of the body region 49 immediately overlies the second subregion 48 of the drain region 46 and is contiguous to the trench 43. The p-n junction 55 between second drain subregion 48 and first body subregion 50 extends parallel to the pair of opposite surfaces 41 and 42 of the substrate 17. The first p-n junction diode $D_a$, FIG. 2, of the switching IGFET 14 is based upon this p-n junction 55.

Being formed by p-type impurity diffusion from the top surface 41 of the substrate 17, the first subregion 50 of the body region 49 has an impurity concentration diminishing from its border on the second body subregion 51 toward its border on the second drain subregion 48. The mean impurity concentration of this p-type first body subregion 50 is higher than that of the n−-type second subregion 48 of the drain region 46, being, say, from $1 \times 10^{16}$ cm$^{-3}$ to $1 \times 10^{17}$ cm$^{-3}$. The first body subregion 50 has its mean p-type impurity concentration so determined as to give rise to the n-channel 56 upon application of a control voltage to the gate electrode $G_1$. The first body subregion 50 may be formed by epitaxial growth of a p-type semiconductor on the second drain subregion 48 instead of by diffusion.

The p−-type second subregion 51 of the body region 49 is contiguous to both first body subregion 50 and trench 43. The second body subregion 51 has a surface exposed at the top surface 41 of the substrate 17 for Schottky contact with the source electrode $S_1$, constituting in combination the Schottky barrier diode seen at $D_c$ in FIG. 2. The second body subregion 51 has a surface impurity concentration of as low as, say, $1 \times 10^{16}$ cm$^{-3}$, a value less than that of the first body subregion 50, in order to enable the Schottky barrier diode $D_c$ to withstand a reverse voltage of 10 volts or more. In this embodiment of the invention the second body subregion 51 is made by diffusing n-type impurities into what has been part of the p-type body region 49, with a concentration less than that of the preexisting p-type impurities, thereby counteracting some of the preexisting p-type impurities with the newly introduced n-type impurities.

The n-type first subregion 53 of the source region 52 is formed contiguous to both trench 43 and second subregion 51 of the body region 49 and has a surface exposed at the top surface 41 of the substrate 17. Created by controlled diffusion of n-type impurities into what has been part of the preformed second body subregion 51, the first source subregion 53 has its impurity concentration diminishing in its depth direction.

The n-type first subregion 53 of the source region 52 and the p−-type second subregion 51 of the body region 49 have a p-n junction 57 therebetween, thus providing the second p-n junction diode $D_b$, FIG. 2, in parallel with the Schottky barrier diode $D_c$. It is desired that the reverse antivoltage strength of this second p-n junction diode $D_b$ be not less than that of the Schottky barrier diode $D_c$. This requirement is met by appropriately setting the n-type impurity concentration of the first source subregion 53, for example at $1 \times 10^{16}$ cm$^{-3}$ through $1 \times 10^{18}$ cm$^{-3}$.

The n+-type second subregion 54 of the source region 52 is formed contiguous to both trench 43 and first source subregion 53 and has a surface exposed at the top surface 41 of the substrate 17. The second source subregion 54 has an n-type impurity concentration of $1 \times 10^{18}$ cm$^{-2}$ through $1 \times 10^{20}$ cm$^{-3}$, which is higher than that of the first source subregion 53. The second source subregion 54 is made by selective diffusion of n-type impurities into what has been part of the preformed n-type first source subregion 53.

The source electrode $S_1$ of the switching IGFET 14 overlies the top surface 41 of the substrate 20, making ohmic contact with both subregions 53 and 54 of the source region 52 and Schottky contact with the second subregion 51 of the body region 49. The source electrode $S_1$ may be made from metal such as aluminum and titanium or from a silicide. Making Schottky contact with the second body subregion 51, the source electrode $S_1$ creates in combination therewith the Schottky barrier diode $D_c$ as aforesaid. Part of the source electrode $S_1$ functions as the cathode of the Schottky barrier diode $D_c$. Being less in p-type impurity concentration than the first body subregion 50, the second body subregion 51 will provide in combination with the source electrode $S_1$ a well-functioning Schottky barrier diode. It will be observed from FIG. 3 that the second body subregion 51 has a surface that is exposed at the top surface 41 of the substrate 17 in the middle of the two neighboring trenches 43 and opposite the channel 56 across the source region 52.

The drain electrode $D_1$ on the underside of the substrate 17 is made from aluminum, titanium-nickel alloy, or other metal. Held against the bottom surface 42 of the substrate 17, the drain electrode $D_1$ makes ohmic contact with the n+-type first subregion 47 of the drain region 46.

The gate electrode $G_1$ is received in the trench 43 in the substrate 17 via the gate insulator 44, the latter being in the form of a silicon oxide film on the substrate surfaces defining the trench 43. The gate electrode $G_1$ is of impurity-doped polycrystalline silicon filling the trench 43. An appropriately doped polycrystalline silicon is sufficiently electroconductive to serve as an electrode, although the gate electrode $G_1$ could be metal made.

Figure 4:
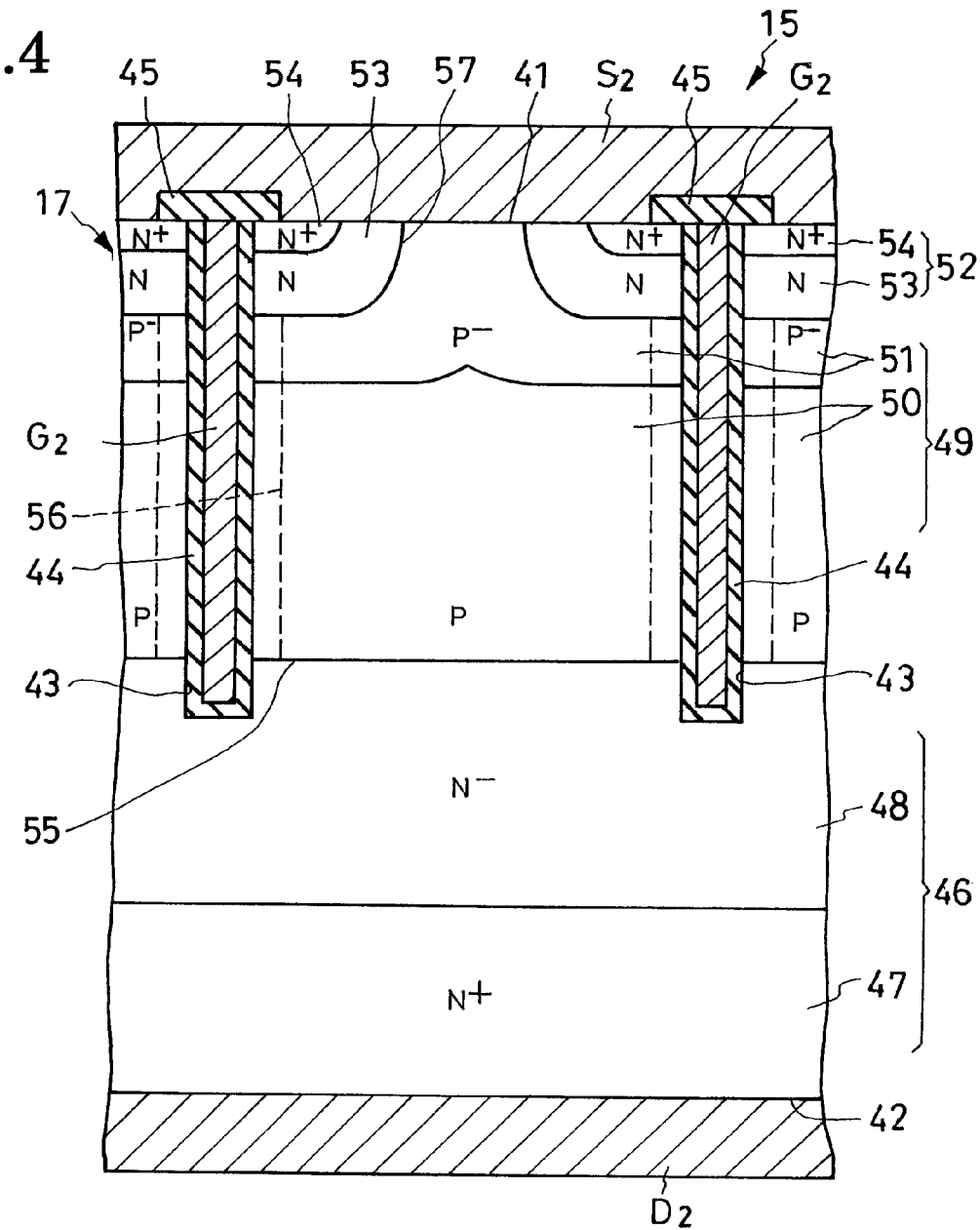
FIG. 4 is a section through the protector IGFET in the switching device of FIGS. 1 and 2, the protector IGFET being shown on a greater scale than is the switching IGFET in FIG. 3.

FIG. 4 is a view similar to FIG. 3 but showing, on a more enlarged scale, the protector IGFET 15 in the switching device 10 of FIGS. 1 and 2. A comparison of FIGS. 3 and 4 will reveal that the switching IGFET 14 and protector IGFET 15 is of like construction; only, the protector IGFET 15 is less than the switching IGFET 14 in both current-carrying capacity and, as will be best understood from FIG. 1, the surface area it occupies in the substrate 17.

A closer inspection of FIGS. 3 and 4 will reveal that the protector IGFET 15 has a source electrode $S_2$, drain electrode $D_2$ and gate electrode $G_2$ in places of their respective counterparts $S_1$, $D_1$ and $G_1$ in the switching IGFET 14. The other components of the protector IGFET 15, including the trench 43, gate insulators 44 and 45, drain region 46, body region 49 and source region 52, are of the same construction and arrangement as their counterparts in the switching IGFET 14 which are designated by like reference numerals. No more repeated explanation of such constituents of the protector IGFET is considered necessary.

It will be appreciated that, being so alike in construction, the switching IGFET 14 and protector IGFET 15 permit concurrent fabrication through the same manufacturing steps. The addition of the protector IGFET 15 to the switching IGFET 14 makes the manufacture of the resulting switching device no more troublesome or time-consuming than in the case where the switching IGFET is unprotected.

With reference back to FIGS. 1 and 2 the gate resistor 16 may take the form of a semiconductor resistor formed on the substrate 17. The gate resistor 16 might also be either a resistive film or discrete member on the substrate 17 or on a circuit board.

Operation

The switching device 10 may be put to use as pictured in FIG. 2, in which the first main terminal 11 of the switching device is shown connected to the positive terminal of the power supply 31 via the load 30, and the second main terminal 12 directly to the negative terminal of the power supply 31. The FET switch $Q_1$ of the switching IGFET 14 will turn on in response to a positive gate control voltage applied from the gate control circuit 32 to the control terminal 13 of the switching device 10.

The FET switch $Q_1$ will turn on, as above, as the channel 56, FIG. 3, is created in the body region 49 of the switching IGFET 14 adjacent the trench 43 in response to the application of an above-threshold gate control voltage between the gate and source of the switching IGFET. The drain current will then flow through the switching IGFET 14 along the path sequentially comprising the drain electrode $D_1$, drain region 46, channel 56, source region 52 and source electrode $S_1$. The first p-n junction diode $D_a$, based upon the p-n junction 55, FIG. 3, between the drain region 46 and body region 49 of the substrate 17, is then reverse biased and so is off There is therefore no current flow through the second p-n junction diode $D_b$ or Schottky barrier diode $D_c$.

The protector IGFET 15, on the other hand, has its gate electrode $G_2$ connected to the source electrode $S_1$ of the switching IGFET 14 as in FIG. 2. The gate electrode $G_2$ of the protector IGFET 15 is therefore less in potential than the source electrode $S_2$ of the protector IGFET while the power supply 31 is delivering a positive voltage. The protector IGFET 15 is off during the delivery of a positive supply voltage.

It is understood that the power supply 31 is connected between the pair of main terminals 11 and 12 of the switching device 10 with its polarity indicated by the solid lines in FIG. 2. The switching IGFET 14 is then off when the gate control voltage from the gate control circuit 32 and the potential of the control terminal 13 are both zero.

Possibly, the power supply 31 may have its polarity reversed as indicated by the broken lines in FIG. 2. In that case the gate electrode $G_2$ of the protector IGFET 15 will gain a positive potential like the second main terminal 12 of the switching device 10 when the gate control voltage from the gate control circuit 32 is zero, that is, when a short-circuiting path is provided between the control terminal 13 and the source electrode $S_1$ of the switching IGFET 14.

Thus the FET switch $Q_2$ of the protector IGFET 15, or the protector IGFET itself, will turn on with the creation of the channel 56, FIG. 4, in the body region 49 of the protector IGFET 15. This protector IGFET will then provide a short path between the drain electrode $D_1$ and gate electrode $G_1$ of the switching IGFET 14. The switching IGFET 14 will stay off as its gate electrode $G_1$ grows less in potential than its body region 49, FIG. 3.

It is now clear that the first p-n junction diode $D_a$ of the switching IGFET 14 is forward biased, and its second p-n junction diode $D_b$ and Schottky barrier diode $D_c$ reverse biased, during application of a reverse voltage between the pair of main terminals 11 and 12 of the switching device 10. The result is the reduction of a reverse current flow through the first p-n junction diode $D_a$ of the switching IGFET 14.

Let us suppose that the switching device 10 were not furnished with the protector IGFET 15 contrary to the teachings of this invention. Then no short-circuiting of the gate electrode $G_1$ and drain electrode $D_1$ of the switching IGFET 14 would occur when the power supply 31 was connected between the pair of main terminals 11 and 12 of the switching device 10 with its polarity reversed like the phantom representation in FIG. 2. As the gate electrode $G_1$ of the switching IGFET thus grew higher in potential than its body region 49, more holes would be depleted from the neighborhood of that part of the p-n junction 57 between body region 49 and source region 52 which is exposed to the trench 43. The depletion layer due to the p-n junction 57 would thus become so thin that a substantive drop in the antivoltage strength of the p-n junction 57 would result.

In contrast, with the provision of the protector IGFET 15 as taught by the instant invention, the gate electrode $G_1$ of the switching IGFET 14 will become less in potential than its body region 49 upon conduction of the protector IGFET 15. No such drop in the antivoltage strength of the second p-n junction diode $D_b$ will occur as pointed out above in the absence of the protector IGFET 15. Thus the second p-n junction diode $D_b$ and Schottky barrier diode $D_c$ block a reverse current flow upon application of a reverse voltage from the power supply 31.

Figure 5:
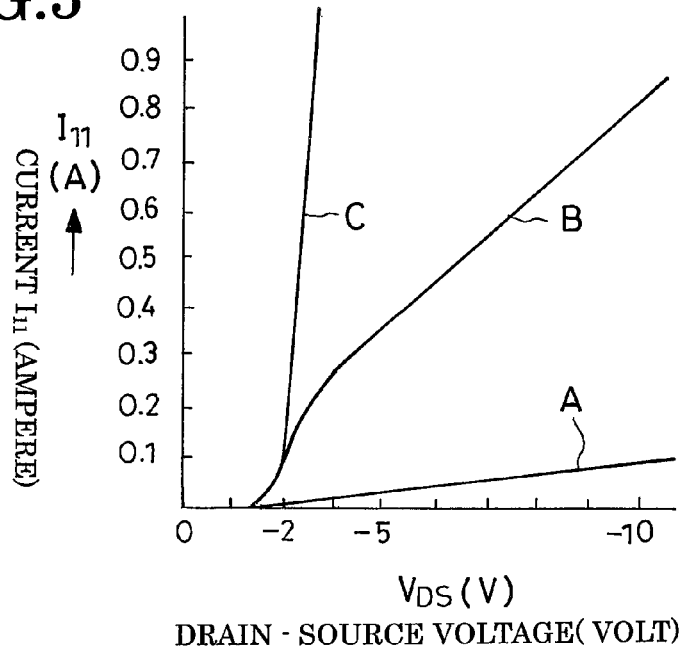
FIG. 5 is a graph plotting the curves of the current flowing through one of the pair of main terminals of the switching device of FIGS. 1 and 2 against the drain-source voltage of the switching IGFET at three different values of the gate resistor, in the case where a power supply is connected in inverse polarity between the pair of main terminals.

When the power supply 31 is connected in reverse polarity as indicated by the broken lines in FIG. 2, the drain-source voltage $V_{DS}$ of the switching IGFET 14 (equivalent to the voltage between the pair of main terminals 11 and 12 of the switching device 10) varies in certain relations with the current $I_{11}$ flowing through the first main terminal 11 of the switching device 10, depending upon the value of the gate resistor 16. The curve A in the graph of FIG. 5 represents the $V_{DS}$-$I_{11}$ relationship when the gate resistor 16 is 100 ohms; the curve B when the gate resistor 16 is 11 ohms; and the curve C when the gate resistor 16 offers no resistance.

The graph proves that the protector IGFET 15 is not turned on when, with the power supply 31 reversed in polarity, the drain-source voltage $V_{DS}$ of the switching IGFET is approximately 1.0-1.5 volts or less. As a result, the potential of the gate electrode $G_1$ of the switching IGFET 14 becomes approximately equal to that of the source electrode $S_1$ and higher than that of the body region 49. The second p-n junction diode $D_b$ is not improved in antivoltage strength. However, since the absolute value of the drain-source voltage $V_{DS}$ of the switching IGFET 14 is less than 1.0-1.5 volts, its drain current is zero or nearly so, being blocked by the second p-n junction diode $D_b$ and Schottky barrier diode $D_c$.

The protector IGFET 15 will turn on when the absolute value of the voltage between the pair of main terminals 11 and 12 of the switching device 10 builds up above 1.0-1.5 volts while the power supply 31 is connected in reverse polarity. When the protector IGFET 15 is on, the current $I_{11}$ will flow along the path sequentially comprising the second main terminal 12, control terminal 13, gate resistor 16, protector IGFET 15 and first main terminal 11.

Referring to FIG. 5 again, the current $I_{11}$ flowing through the first main terminal 11 of the switching device 10 changes with the particular resistance offered by the gate resistor 16 and with the drain-source voltage $V_{DS}$ of the switching IGFET 14 as follows:

(a) The current $I_{11}$ is approximately 0.1 ampere when the drain-source voltage $V_{DS}$ is –10 volt and the gate resistor 16 is 100 ohms (Curve A).

(b) The current $I_{11}$ is approximately 0.9 ampere when the drain-source voltage $V_{DS}$ is –10 volt and the gate resistor 16 is 11 ohms (Curve B).

(c) The current $I_{11}$ is extremely large when the drain-source current $V_{DS}$ is approximately –2 volt and the gate resistor 16 offers no resistance at all (Curve C).

It is recommended from the foregoing results that the gate resistor 16 be from about 10 ohms to about 30 kilohms for proper control of the current $I_{11}$ during application of a reverse voltage.

The switching IGFET 14 will turn on upon application of a positive voltage to the control terminal 13 of the switching device 10 from the gate control circuit 32 while the power supply 31 is connected in reverse polarity. The protector IGFET 15 will then remain off since its gate electrode $G_2$ will be less in potential than its source electrode $S_2$. As a result, the gate electrode $G_1$ of the switching IGFET 14 will become higher in potential than its source electrode $S_1$ or drain electrode $D_1$, so the switching IGFET 14 will turn on as above.

The advantages gained by the above described first embodiment of the invention may be recapitulated as follows:

1. Created with a polarity opposite to that of the first p-n junction diode $D_a$ of the switching IGFET 14, the Schottky barrier diode $D_c$ effectively blocks current flow through other than the channel 56 of the switching IGFET 14 upon application of a reverse voltage when its source electrode $S_1$ is higher in potential than its drain electrode $D_1$.

2. The protector IGFET 15 turns on, providing a short path between the gate and drain electrodes $G_1$ and $D_1$ of the switching IGFET 14 upon application of a reverse voltage to the latter. As the gate electrode $G_1$ of the switching IGFET 14 thus grows less in potential than its body region 49, the depletion layer does not become thin at that part of the p-n junction 57 between the body region 49 and source region 52 of the switching IGFET 14 which is exposed to the trench 43. Thus is the second p-n junction diode $D_b$ of the switching IGFET 14 saved from a drop in antivoltage strength, with the result that the second p-n junction diode $D_b$ and Schottky barrier diode $D_c$ reliably prevent a reverse current flow upon application of a reverse voltage.

3. Integrally comprising the two IGFETs 14 and 15, the switching device 10 has but three terminals for connection to external circuitry and so lends itself to use as a unitary three-terminal device. Besides being itself convenient of use, the switching device 10 makes it possible to lessen the component parts of the apparatus incorporating the same and is substitutable for a conventional mechanical relay or the like.

4. The switching and protector IGFETs 14 and 15 are of like construction except for differences in current-carrying capacity and dimensions. They are therefore manufacturable concurrently and through the same processing steps to greatly facilitate, and make less costly, the production of the switching device 10. The protector IGFET 15 is just as strong in antivoltage strength as the switching IGFET 14, and so is the complete switching device 10.

5. The surface area occupied by the protector IGFET 15 in the switching device 10 can be as small as from one tenth to one hundredth of that by the switching IGFET 14. The switching device 10 can therefore be made less in size than the prior art device having a switching IGFET connected in series with a reverse-blocking diode. In applications where the switching device according to the invention can be as large as its conventional counterpart, the size of the switching IGFET 14 relative to that of the protector IGFET 15 may be made even greater for reduction of the on-resistance of the switching IGFET.

6. Both switching and protector IGFETs 14 and 15 are trenched, permitting reduction in size and on-resistance.

7. The current control of the switching IGFET 14 is possible by the gate control circuit 32 when both a positive and a negative voltage is being applied to the switching IGFET 14.

8. The switching IGFET 14 has its drain region 46 subdivided into the $n^+$-type first subregion 47 and $n^-$-type second subregion 48, its body region 49 into the p-type first subregion 50 and $p^-$-type second subregion 51, and its source region 52 into the n-type first subregion 53 and $n^+$-type second subregion 54. The protector IGFET 15 has its constituent regions similarly subdivided into subregions. So finely divided into subregions, the resulting IGFETs 14 and 15 are highly favorable in antivoltage strength and other electrical properties.

9. With reference to FIGS. 3 and 4 the substrate 17 has formed therein the second body subregion 51 in order to obtain the Schottky barrier diode $D_c$ or $D_c'$, and the relatively low impurity concentration first source subregion 53 in order to suppress the parasitic npn transistor action due to the drain region 46, body region 49 and source region 52. Nevertheless, the distance between the lower extremity of the channel 56 to the first drain subregion 47 (i.e., the thickness of the second drain subregion 48) is not increased. That is to say that the second drain subregion 48 has a constant thickness regardless of the presence or absence of the second body subregion 51 and first source subregion 53. Both IGFETs 14 and 15 are thus kept from any increase in on-resistance.

10. The transverse dimensions of both IGFETs 14 and 15 are kept at a minimum because the first subregion 50 of the body region 49 is formed by nonselective diffusion and because both subregions 53 and 54 of the source region 52 have their lateral expansions limited by the trenches 43.

Figure 6:
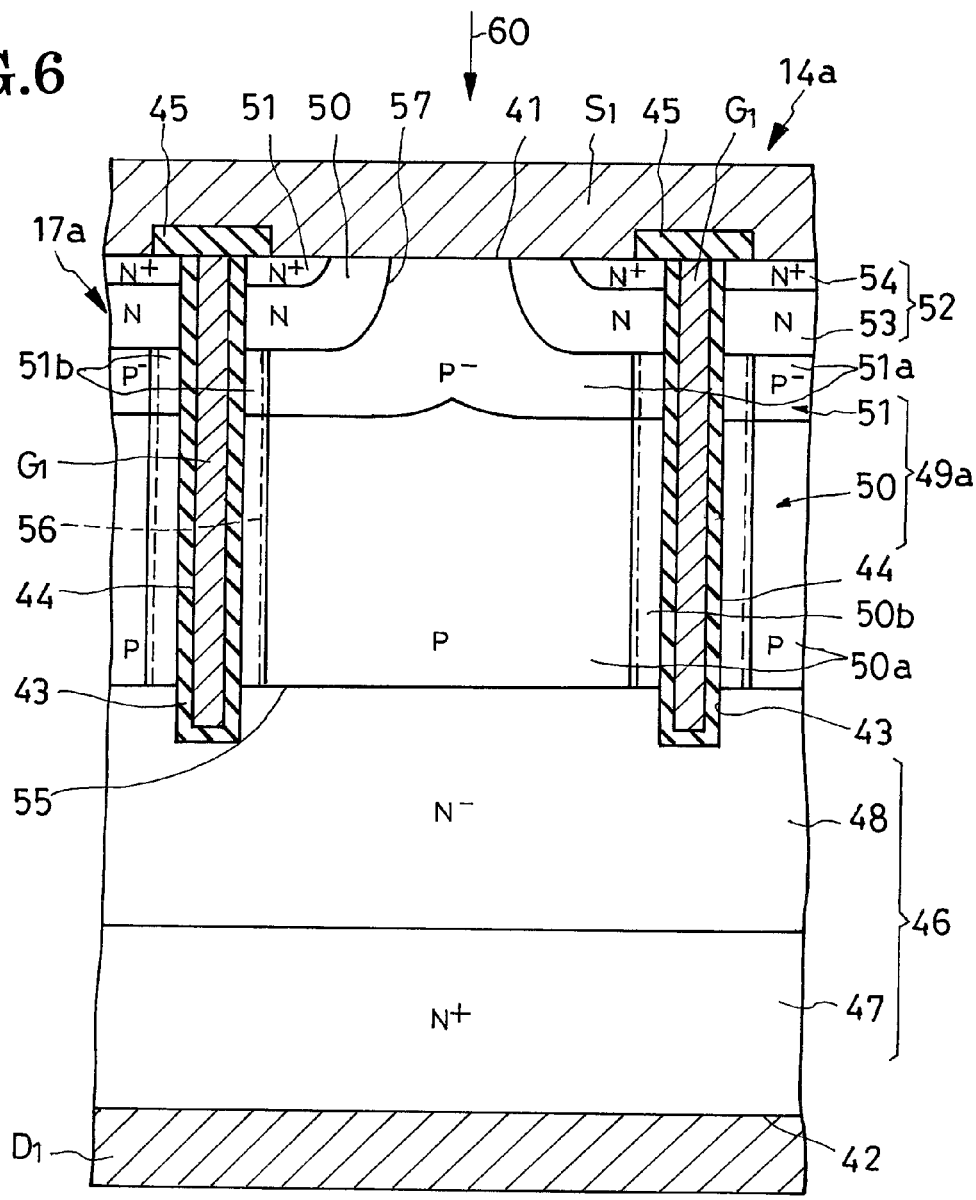
FIG. 6 is a section through a modification of the switching IGFET of FIG. 3.

Embodiment of FIG. 6

The switching IGFET 14, FIG. 3, of the switching device 10, FIGS. 1 and 2, is shown modified in FIG. 6 and therein generally designated $14_a$. The switching IGFET $14_a$ features the following modifications in the body region $49_a$ of the substrate $17_a$, all the other details of construction and method of fabrication being as previously stated in conjunction with FIG. 3:

1. The first subregion 50 of the body region $49_a$ of the substrate $17_a$ is further subdivided into a first subsection $50_a$ located centrally between every two neighboring trenches 43 and second subsection $50_b$ of higher impurity concentration formed around each trench 43 by p-type impurity introduction. The second subsection $50_b$ has a higher impurity concentration than the first subsection $50_a$.

2. The second subregion 51 of the body region $49_a$ of the substrate $17_a$ is likewise subdivided into a first subsection $51_a$ located centrally between every two neighboring trenches 43 and second subsection $51_b$ of higher impurity concentration formed around each trench 43 by p-type impurity introduction. The second subsection $51_b$ has a higher impurity concentration than the first subsection $51_a$.

3. At least the body region $49_a$ of the substrate $17_a$ comprising the two subregions 50 and 51 with their subsections, is irradiated with an electron beam.

The higher p-type impurity concentration second subsections $50_b$ and $51_b$ of the subregions 50 and 51 of the body region $49_a$ are intended to make higher the threshold voltage of this switching IGFET 14. These second subsections $50_b$ and $51_b$ correspond to those parts of the body subregions 50 and 51 where the channel 56 is to be formed. It is unnecessary that, unlike the showing of FIG. 6, the second subsection $50_b$ of the first body subregion 50 extend throughout the length of the channel 56 in the first body subregion 50; instead, the second subsection $50_b$ may be formed only in upper part of the first body subregion 50. It is not required, either, that the second subsection $51_b$ of the second body subregion 51 extend throughout the length of the channel 56 in the second body subregion 51. The second subsection $51_b$ of the second body subregion 51 may extend instead along only part of the length of the channel 56 in the second subregion 51 or even may not exist at all.

The modified switching IGFET $14_a$, with its higher p-type impurity concentration second subsections $50_b$ and $51_b$ of the two body subregions 50 and 51, has a threshold voltage higher than that of the first disclosed switching IGFET 14, FIG. 3, by as much as one volt or so. Occupying so small parts of the substrate $17_a$, however, the second subsections $50_b$ and $51_b$ hardly affect the antivoltage strength or on-resistance of the switching IGFET $14_a$.

As indicated by the arrow 60 in FIG. 6, and as has been mentioned above, the substrate $17_a$ of the switching IGFET $14_a$ is bombarded with an electron beam of, say, two megaelectronvolts (MeV) for a preassigned period of time via the source electrode $S_1$. Then the substrate $17_a$ is heated to 300° C. or more in a hydrogen-containing atmosphere. This thermal aftertreatment is meant to restore the substrate $17_a$ from damage that may have been inflicted on the Si—$SiO_2$ interfaces by the electron beam bombardment.

The electron beam bombardment of the substrate $17_a$ results in a shorter lifetime of the minority carriers in the two subregions 50 and 51 of the body region $49_a$. With their lifetime thus shortened, the electrons (minority carriers) that have been injected from the n⁻-type second subregion 48 of the drain region 46 into both subregions 50 and 51 of the body region $49_a$ during application of a reverse voltage to the switching IGFET $14_a$ will quickly combine with holes and so be kept from flowing as far up as into the n-type first subregion 53 of the source region 52.

Thus is the switching IGFET $14_a$ improved in antivoltage strength as its current leakage is reduced to a minimum. Experiment has proved that by lowering the minority carrier lifetime in the body region $49_a$ of the substrate $17_a$ to one tenth of that in the prior art IGFET, the switching IGFET $14_a$ becomes capable of withstanding a voltage of 21 volts, compared with only 15 volts withstood by the prior art IGFET.

The substrate $17_a$ may be subjected to electron beam irradiation either wholly or locally. The noted objective of electron beam irradiation is also attainable by distributing gold or like lifetime killer in both subregions 50 and 51 of the body region $49_a$. The switching IGFET $14_a$ of FIG. 6 may be put to use in combination with either the protector IGFET 15 of the FIG. 5 construction or its modification, not shown, that is built upon the teachings of the switching IGFET $14_a$. The embodiment of FIG. 6 offers all the listed advantages of the first disclosed embodiment in addition to a higher threshold voltage and greater antivoltage strength.

Figure 7:
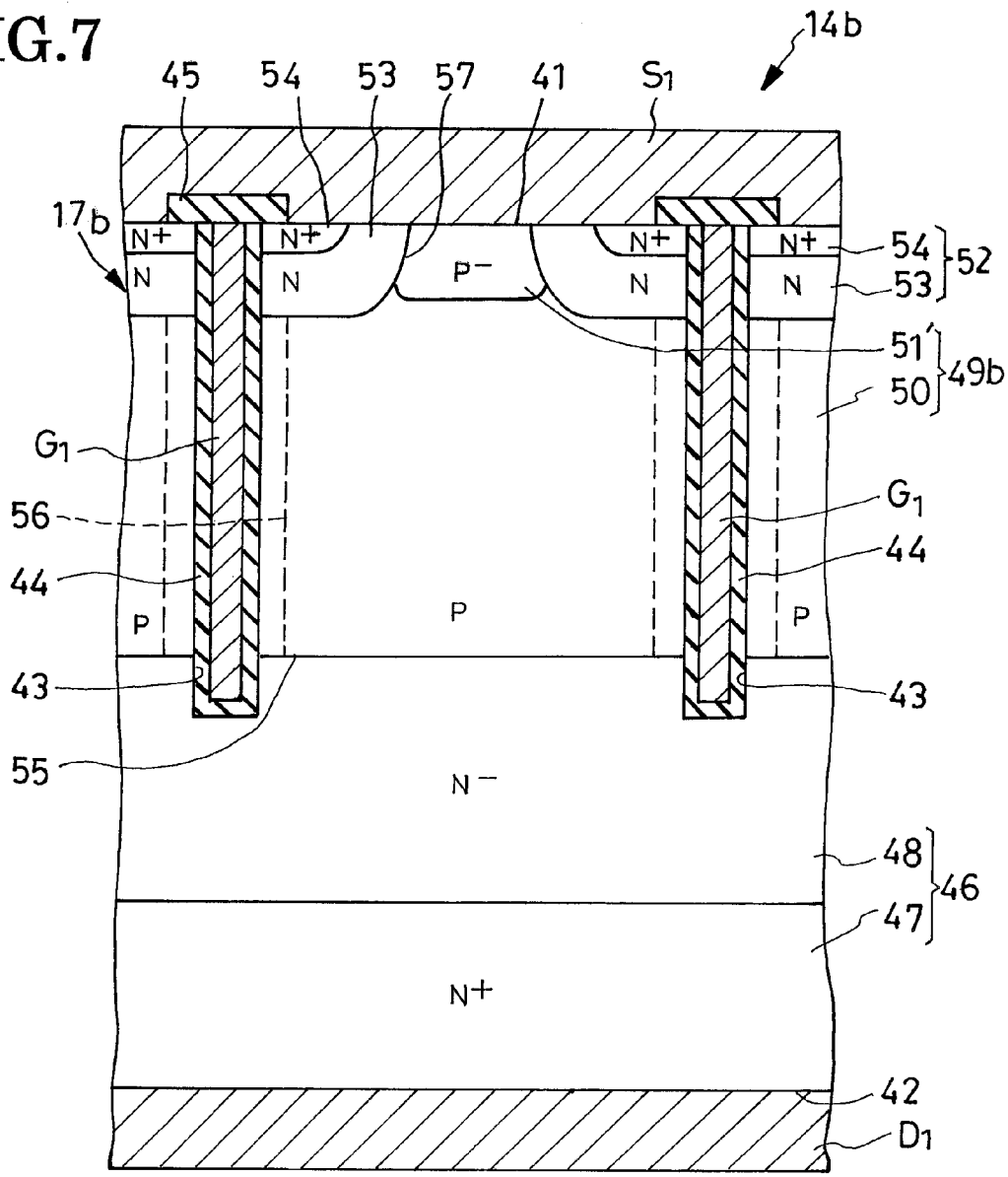
FIG. 7 is a section through another modification of the switching IGFET of FIG. 3.

Embodiment of FIG. 7

Another modified switching IGFET $14_b$ shown here is of the same construction as its FIG. 3 counterpart 14 except for the location of the p⁻-type second subregion 51' of the body region $49_b$. Unlike its FIG. 3 counterpart 51, the second body subregion 51' of the switching IGFET $14_b$ is located only between the two neighboring source regions 52, some distances away from the trenches 43, and has a surface exposed at the top surface 41 of the substrate $17_b$. The second body subregion 51' is intended to coact with the immediately overlying source electrode $S_1$ to provide a Schottky barrier diode. This objective is met even if, as in this embodiment, the second body subregion 51' is narrowly confined only between the trenches 43.

In this FIG. 7 embodiment, too, the first subregion 50 of the body region $49_b$ could be divided further into the subsections similar to those designated $50_a$ and $50_b$ in FIG. 6. Further the substrate $17_b$ may be subjected to electron beam bombardment for shortening the lifetime of the minority carriers in the body subregions 50 and 51'. The switching IGFET $14_b$ of FIG. 7 may be put to use in combination with a protector IGFET of either the same construction as the switching IGFET $14_b$ or some different construction.

Figure 8:
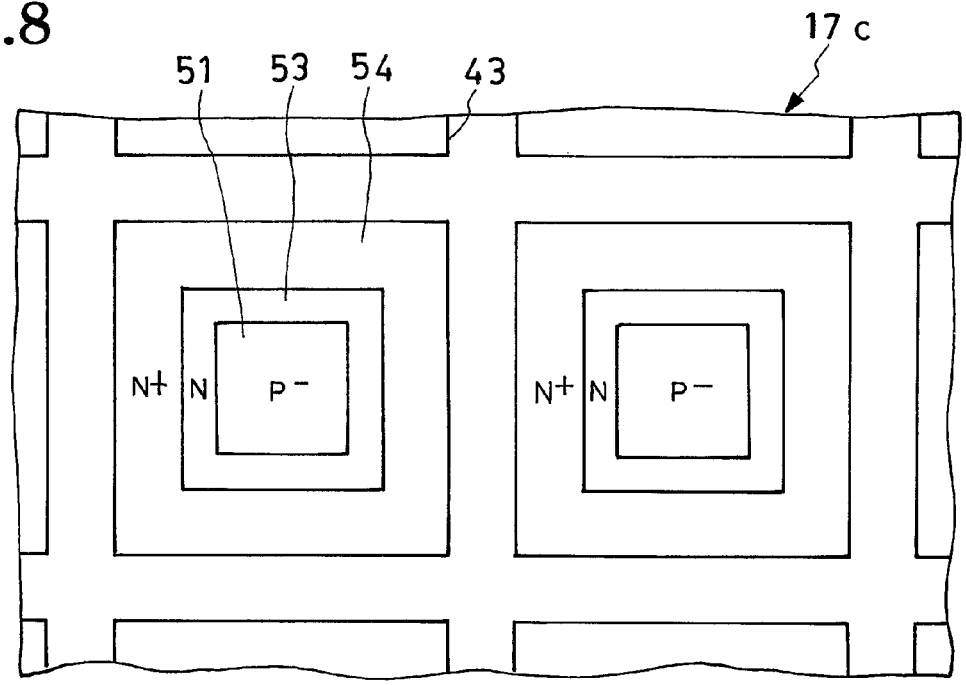
FIG. 8 is a fragmentary plan view of a modified semiconductor substrate configured to carry out the concepts of the present invention.

Embodiment of FIG. 8

In a further modified substrate $17_c$ for the switching IGFET of the switching device according to the invention, trenches or wells are arrayed in columns and rows as at 43 in FIG. 8. Each trench or well 43 has concentrically arranged therein a p⁻-type second body subregion 51, n-type first source subregion 53, and n⁺-type second source subregion 54. The switching IGFET incorporating the modified substrate $17_c$ operates like its counterpart 14 in the first disclosed embodiment. The protector IGFET for combined use with the switching IGFET is also modifiable similarly.

Figure 9:
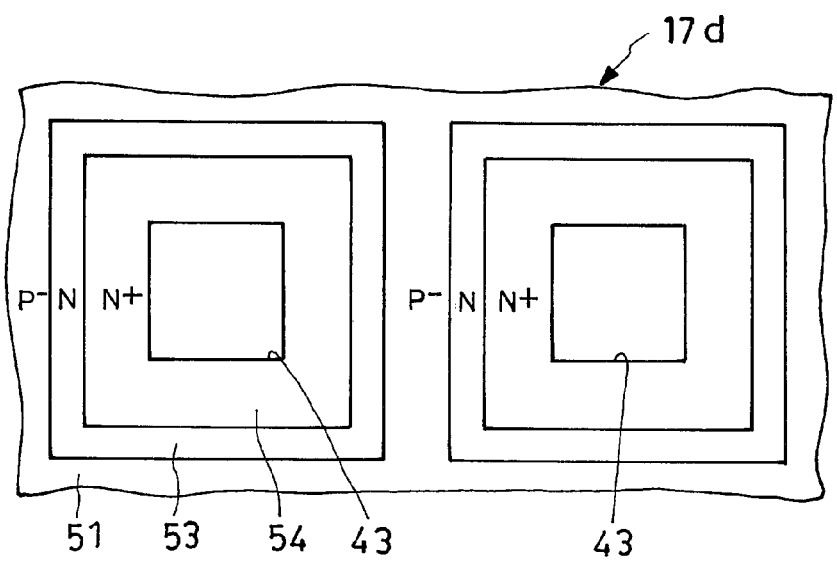
FIG. 9 is a view similar to FIG. 8 but showing another modified semiconductor substrate suitable for use in the practice of the present invention.

Embodiment of FIG. 9

In a further modified substrate $17_d$ for the switching IGFET of the switching device according to the invention, each trench or well 43 is of columnar shape and is concentrically surrounded by an n⁺-type second source subregion 54, n-type first source subregion 53, and p⁻-type second body subregion 51. The switching IGFET incorporating the modified substrate $17_d$ operates like its counterpart 14 in the first disclosed embodiment. The protector IGFET for combined use with the switching IGFET may, or may not, be modified similarly.

Figure 10:
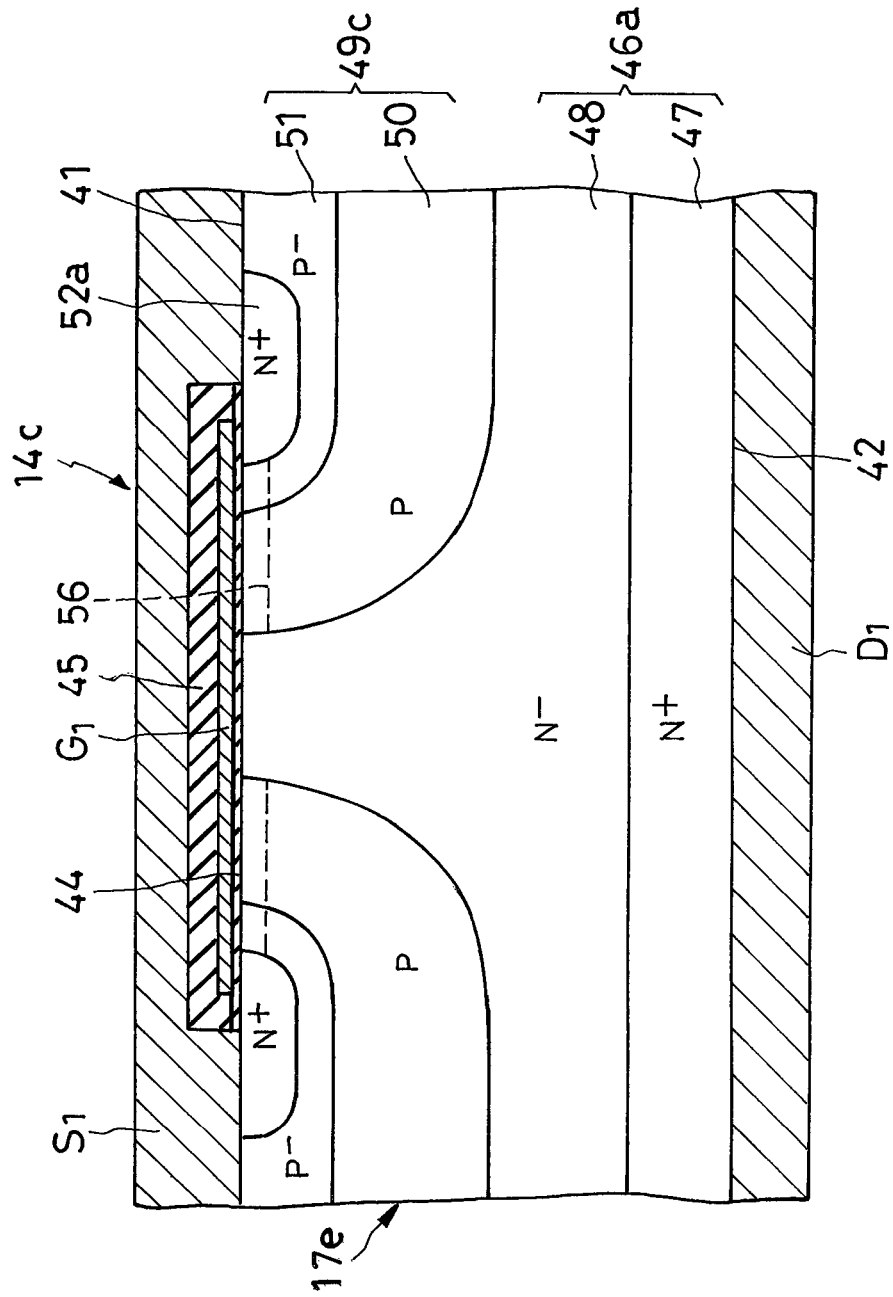
FIG. 10 is a section through a further modification of the switching IGFET of FIG. 3.

Embodiment of FIG. 10

The switching IGFET of the switching device according to the invention is further modifiable as depicted at IGFET $14_c$ in FIG. 10. The switching IGFET $14_c$ takes the form of a planar configuration, with the gate electrode $G_1$ placed on the top surface 41 of the substrate $17_e$ via the gate insulator 44. The drain region $46_a$ and body region $49_c$ are both partly exposed at the top surface 41 of the substrate $17_e$. Like its FIG. 3 counterpart 46, the drain region $46_a$ comprises the n⁺-type first subregion 47 and n⁻-type second subregion 48. It is only the second drain subregion 48 that is exposed at the top surface 41 of the substrate $17_e$. The body region $49_c$ comprises a p-type first subregion 50 and a p⁻-type second subregion 51, which are both formed island-like in the second drain subregion 48. The source region 52$_a$ is formed island-like in the second body subregion 51.

The gate insulator 44 is formed on the top surface 41 of the substrate 17$_e$ so as to cover at least the exposed surfaces of the body region 49$_c$. The gate electrode G$_1$ is held against the exposed surfaces of the body region 49$_c$ via the gate insulator 44. The source electrode S$_1$ makes ohmic contact with the source region 52$_a$ and Schottky contact with the second body subregion 51.

Thus, electrically, the switching IGFET 14$_c$ is of the same design as its FIG. 2 counterpart 14. This switching IGFET 14$_c$ can therefore be incorporated in the switching device 10 of FIGS. 1 and 2 in place of that designated 14 therein. The protector IGFET 15 of the switching device 10 is modifiable as in FIG. 10.

Figure 11:
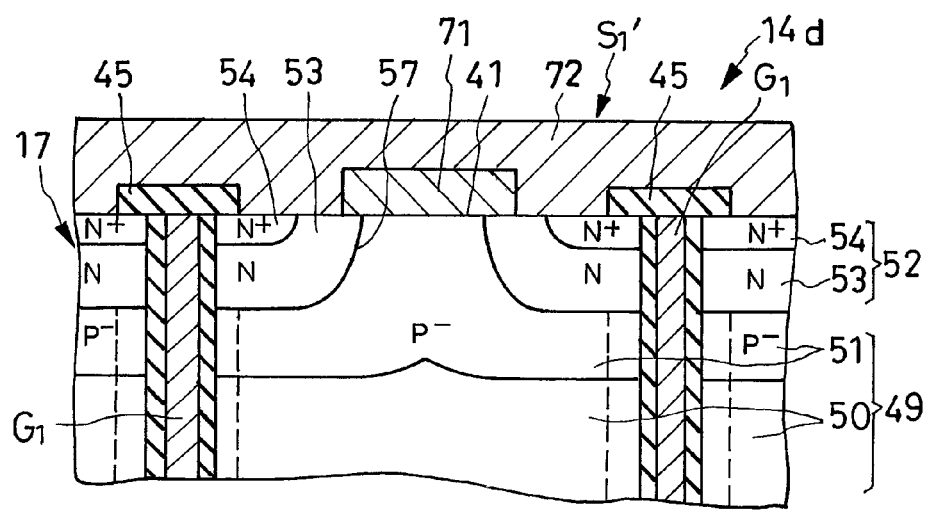
FIG. 11 is a fragmentary section through a still further modification of the switching IGFET of FIG. 3.

Embodiment of FIG. 11

An additional modification of the switching IGFET for the switching device according to the invention is designated 14$_d$ in FIG. 11. It features a modified source electrode S$_1$', all the other details of construction being as previously set forth with reference to FIG. 3. The source electrode S$_1$' is comprised of a first metal part 71 placed on the top surface 41 of the substrate 17 in Schottky contact with the second subregion 51 of the body region 49, and a second metal part 72 overlying the substrate top surface 41 in ohmic contact with both subregions 53 and 54 of the source region 52. The two metal parts 71 and 72 are in direct electrical contact with each other.

The switching IGFET 14$_d$ with the two-part source electrode S$_1$' offers the same advantages as does its FIG. 3 counterpart 14. The protector IGFET 15 of the switching device 10, FIGS. 1 and 2, is also modifiable as taught by FIG. 11.

POSSIBLE MODIFICATIONS

The present invention is not to be limited by the exact details of the illustrated embodiments of the invention but admits of modifications such as the following:

1. The switching device according to the invention may not necessarily be in the form of a monolithic integrated circuit but of a hybrid one or even an assembly of discrete parts or components.

2. The gate resistor 16 may be a layer of polycrystalline silicon or like material formed on the substrate via an insulating layer, rather than part of the substrate itself rendered resistive by impurity diffusion.

3. The switching and protector IGFETs of the switching device according to the invention may differ in electrical characteristics such as threshold voltage and antivoltage strength.

4. The switching IGFET 14, 14$_a$, 14$_b$, 14$_c$ or 14$_d$ may be put to combined use with a protector switch or switch means other than the protector IGFET 15 to make up the reverse-current-protected switching device according to the invention. An example is one or more IGFETs containing a parasitic diode similar to the first p-n junction diode D$_a$, FIG. 2, but not containing a Schottky barrier diode.

5. Instead of subdividing the source region 52 into the two subregions 53 and 54 of distinctly different n-type impurity concentrations by diffusing impurities twice, the impurity concentration of the region 52 may be gradually lessened as it extends away from the substrate surface 41 toward the body region 49.

What is claimed is:

1. A switching device for an electric circuit, comprising:
   (a) a pair of main terminals to which a voltage is to be applied;
   (b) a main control terminal for inputting a control signal;
   (c) an insulated-gate field-effect transistor for performing a switching function for the switching device, comprising:
      (i) a drain region of a first conductivity type;
      (ii) a body region of a second conductivity type formed contiguous to the drain region and having an exposed surface;
      (iii) a source region of the first conductivity type formed in the body region and having an exposed surface;
      (iv) a drain electrode disposed in ohmic contact with the drain region and electrically coupled to one of the pair of main terminals;
      (v) a source electrode disposed in ohmic contact with the source region and in Schottky contact with the body region and electrically coupled to the other of the pair of main terminals;
      (vi) a gate insulator covering the exposed surface of the body region between the source region and the drain region; and
      (vii) a gate electrode held against the exposed surface of the body region via the gate insulator; and
   (d) protector switch means for protecting the insulated-gate field-effect transistor by becoming conductive when a voltage oriented to reverse-bias the Schottky contact of the insulated-gate field-effect transistor is applied between the drain and source electrodes of the insulated-gate field-effect transistor, the protector switch means comprising:
      (i) a first main terminal connected to the drain electrode of the insulated-gate field-effect transistor;
      (ii) a second main terminal connected to the gate electrode of the insulated-gate field-effect transistor; and
      (iii) a control terminal.

2. A switching device as defined in claim 1, wherein the control terminal of the protector switch means is connected to the source electrode of the insulated-gate field-effect transistor in order to hold the protector switch means on when the control signal for turning the insulated-gate field-effect transistor on is not applied to the main control terminal of the switching device while the voltage oriented to reverse-bias the Schottky contact of the insulated-gate field-effect transistor is applied between the drain and source electrodes of the insulated-gate field-effect transistor.

3. A switching device as defined in claim 1, further comprising a resistor electrically connected between the main control terminal and the gate electrode of the insulated-gate field-effect transistor.

4. A switching device as defined in claim 1, wherein the protector switch means is a semiconductor switch formed on the same semiconductor substrate as the insulated-gate field-effect transistor.

5. A switching device as defined in claim 1, wherein the protector switch means is a second insulated-gate field-effect transistor for selectively providing a short-circuit path between the drain and gate electrodes of the first recited insulated-gate field-effect transistor, the second insulated-gate field-effect transistor comprising:
   (a) a drain region of a first conductivity type;
   (b) a body region of a second conductivity type formed contiguous to the drain region of the second insulated-gate field-effect transistor and having an exposed surface;

(c) a source region of the first conductivity type formed in the body region and having an exposed surface;
(d) a drain electrode disposed in ohmic contact with the drain region of the second insulated-gate field-effect transistor and electrically connected to the drain electrode of the first insulated-gate field-effect transistor;
(e) a source electrode disposed in ohmic contact with the source region of the second insulated-gate field-effect transistor and in Schottky contact with the body region of the second insulated-gate field-effect transistor and electrically connected to the gate electrode of the first insulated gate field-effect transistor;
(f) a gate insulator covering the exposed surface of the body region of the second insulated-gate field-effect transistor between the source region and the drain region thereof; and
(g) a gate electrode held against the exposed surface of the body region of the second insulated-gate field-effect transistor via the gate insulator and electrically connected to the source electrode of the first insulated-gate field-effect transistor.

6. A switching device as defined in claim 5, wherein the second insulated-gate field-effect transistor is less in current-carrying capacity than the first insulated-gate field-effect transistor.

7. A switching device as defined in claim 5, wherein the drain region of each of the first and the second insulated-gate field-effect transistor comprises a first drain subregion of the first conductivity type, and a second drain subregion formed contiguous to the first drain subregion of the drain region and having a lower first conductivity type impurity concentration than the first drain subregion of the drain region;
wherein the body region of each of the first and the second insulated-gate field-effect transistor comprises a first body subregion of the second conductivity type formed contiguous to the second drain subregion of the drain region, and a second body subregion formed contiguous to the first body subregion of the body region and having a lower second conductivity type impurity concentration than the first body subregion of the body region, the second body subregion of the body region having the exposed surface; and
wherein the source region of each of the first and the second insulated-gate field-effect transistor comprises a first source subregion of the first conductivity type formed in the second body subregion of the body region and having the exposed surface, and a second source subregion formed in the first source subregion of the source region and having a higher first conductivity type impurity concentration than the first source subregion of the source region.

8. A switching device for an electric circuit, comprising:
(a) a pair of main terminals to which a voltage is to be applied;
(b) a main control terminal for inputting a control signal;
(c) an insulated-gate field-effect transistor for performing a switching function for the switching device, comprising:
(i) a substrate of semiconducting material having a pair of opposite major surfaces and a trench extending from one of the pair of major surfaces toward the other;
(ii) a drain region of a first conductivity type formed in the substrate and having a surface exposed at said other major surface of the substrate;
(iii) a body region of a second conductivity type formed in the substrate contiguous to the drain region and having a surface exposed to the trench in the substrate and another surface exposed at said one major surface of the substrate;
(iv) a source region formed in the substrate contiguous to the body region and having a surface exposed to the trench and another surface exposed at said one major surface of the substrate;
(v) a drain electrode disposed on said other major surface of the substrate in ohmic contact with the drain region and electrically connected to one of the pair of main terminals;
(vi) a source electrode disposed on said one major surface of the substrate in ohmic contact with the source region and in Schottky contact with the body region and electrically connected to the other of the pair of main terminals;
(vii) a gate insulator formed in the trench in the substrate and covering at least the surface of the body region exposed to the trench; and
(viii) a gate electrode disposed in the trench in the substrate and held via the gate insulator against the surface of the body region exposed to the trench; and
(d) protector switch means for protecting the insulated-gate field-effect transistor by becoming conductive when a voltage oriented to reverse-bias the Schottky contact of the insulated-gate field-effect transistor is applied between the drain and source electrodes of the insulated-gate field-effect transistor, the protector switch means comprising:
(i) a first main terminal connected to the drain electrode of the insulated-gate field-effect transistor;
(ii) a second main terminal connected to the gate electrode of the insulated-gate field-effect transistor; and
(iii) a control terminal.

9. A switching device as defined in claim 8, wherein the control terminal of the protector switch means is connected to the source electrode of the insulated-gate field-effect transistor in order to hold the protector switch means on when the control signal for turning the insulated-gate field-effect transistor on is not applied to the main control terminal of the switching device while the voltage oriented to reverse-bias the Schottky contact of the insulated-gate field-effect transistor is applied between the drain and source electrodes of the insulated-gate field-effect transistor.

10. A switching device as defined in claim 8, further comprising a resistor connected between the main control terminal and the gate electrode of the insulated-gate field-effect transistor.

11. A switching device as defined in claim 8, wherein the protector switch means is a semiconductor switch formed on the same semiconductor substrate as the insulated-gate field-effect transistor.

12. A switching device as defined in claim 8, wherein the protector switch means is a second insulated-gate field-effect transistor for selectively providing a short-circuit path between the drain and gate electrodes of the first recited insulated-gate field-effect transistor, the second insulated-gate field-effect transistor comprising:
(a) a substrate of semiconducting material having a pair of opposite major surfaces and a trench extending from one of the pair of major surfaces toward the other;
(b) a drain region of a first conductivity type formed in the substrate of the second insulated-gate field-effect transistor and having a surface exposed at said other major surface of the substrate;
(c) a body region of a second conductivity type formed in the substrate of the second insulated-gate field-effect transistor contiguous to the drain region of the second insulated-gate field-effect transistor and having a surface exposed to the trench in the substrate of the second insulated-gate field-effect transistor and another surface exposed at said one major surface of the substrate of the second insulated-gate field-effect transistor;

(d) a source region formed in the substrate of the second insulated-gate field-effect transistor contiguous to the body region of the second insulated-gate field-effect transistor and having a surface exposed to the trench in the substrate of the second insulated-gate field-effect transistor and another surface exposed at said one major surface of the substrate of the second insulated-gate field-effect transistor;

(e) a drain electrode disposed on said other major surface of the substrate of the second insulated-gate field-effect transistor in ohmic contact with the drain region of the second insulated-gate field-effect transistor and electrically connected to the drain electrode of the first insulated-gate field-effect transistor;

(f) a source electrode disposed on said one major surface of the substrate of the second insulated-gate field-effect transistor in ohmic contact with the source region of the second insulated-gate field-effect transistor and in Schottky contact with the body region of the second insulated-gate field-effect transistor and electrically connected to the gate electrode of the first insulated-gate field-effect transistor;

(g) a gate insulator formed in the trench in the substrate of the second insulated-gate field-effect transistor and covering at least the surface of the body region of the second insulated-gate field-effect transistor which is exposed to the trench in the substrate of the second insulated-gate field-effect transistor; and (h) a gate electrode disposed in the trench in the substrate of the second insulated-gate field-effect transistor and held via the gate insulator of the second insulated-gate field-effect transistor against the surface of the body region of the second insulated-gate field-effect transistor which is exposed to the trench, the gate electrode of the second insulated-gate field-effect transistor being electrically connected to the source electrode of the first insulated-gate field-effect transistor.

13. A switching device as defined in claim 12, wherein the second insulated-gate field-effect transistor is less in current-carrying capacity than the first insulated-gate field-effect transistor.

14. A switching device as defined in claim 12, wherein the drain region of each of the first and the second insulated-gate field-effect transistor comprises a first drain subregion of the first conductivity type, and a second drain subregion formed contiguous to the first drain subregion of the drain region and having a lower first conductivity type impurity concentration than the first drain subregion of the drain region;

wherein the body region of each of the first and the second insulated-gate field-effect transistor comprises a first body subregion of the second conductivity type formed contiguous to the second drain subregion of the drain region, and a second body subregion formed contiguous to the first body subregion of the body region and having a lower second conductivity type impurity concentration than the first body subregion of the body region, the second body subregion of the body region having the exposed surface; and wherein the source region of each of the first and the second insulated-gate field-effect transistor comprises a first source subregion of the first conductivity type formed in the second body subregion of the body region and having both the surface exposed to the trench in the substrate and the surface exposed at said one major surface of the substrate, and a second source subregion formed in the first source subregion of the source region and having both the surface exposed to the trench in the substrate and the surface exposed at said one major surface of the substrate, the second source subregion of the source region being higher in first conductivity type impurity concentration than the first source subregion of the source region.

15. A switching device as defined in claim 8, wherein the body region of the insulated-gate field-effect transistor comprises a first body subregion spaced from the trench and a second body subregion contiguous to the trench, the second body subregion of the body region being higher in second conductivity type impurity concentration than the first body subregion of the body region.

16. A switching device as defined in claim 8, wherein the body region of the insulated-gate field-effect transistor has minority carriers that have a lifetime shortened by electron beam irradiation.

* * * * *